(12) United States Patent
Towns et al.

(10) Patent No.: US 7,674,530 B2
(45) Date of Patent: *Mar. 9, 2010

(54) LUMINESCENT POLYMER

(75) Inventors: Carl Towns, Essex (GB); Richard O'Dell, Taufkirchen (DE); Andrea Lux, Jena (DE)

(73) Assignee: Cambridge Display Technology Limited, Cambridgeshire (GB)

( * ) Notice: Subject to any disclaimer, the term of this patent is extended or adjusted under 35 U.S.C. 154(b) by 862 days.

This patent is subject to a terminal disclaimer.

(21) Appl. No.: 10/204,993

(22) PCT Filed: Feb. 26, 2001

(86) PCT No.: PCT/GB01/00825

§ 371 (c)(1),
(2), (4) Date: Dec. 2, 2002

(87) PCT Pub. No.: WO01/62869

PCT Pub. Date: Aug. 30, 2001

(65) Prior Publication Data

US 2005/0064231 A1    Mar. 24, 2005

(30) Foreign Application Priority Data

Feb. 25, 2000    (GB) .................. 0004541.9

(51) Int. Cl.
*H01J 1/62*    (2006.01)
*H01L 51/00*    (2006.01)
*C09K 11/08*    (2006.01)
*C07D 241/36*    (2006.01)
*C08G 75/00*    (2006.01)

(52) U.S. Cl. .............. 428/690; 428/917; 313/504; 313/506; 257/40; 257/103; 252/301.35; 528/377; 528/394; 528/397; 528/403; 528/423; 544/349

(58) Field of Classification Search ........ 428/690, 428/917; 313/504, 506; 252/301.16, 301.35; 525/204; 257/40, 103, 102; 528/7, 8, 377, 528/380, 394, 397, 423; 544/338, 349, 350, 544/353; 488/917

See application file for complete search history.

(56) References Cited

U.S. PATENT DOCUMENTS 5,077,142 A    12/1991    Sakon et al. ............... 428/690

(Continued)

FOREIGN PATENT DOCUMENTS

DE    197 09 185    10/1997

OTHER PUBLICATIONS

Yamamoto, Takakazu, et al: ".pi.-Conjugated Donor—Acceptor Copolymers Constituted of .pi.—Excessive and .pi.—Deficient Arylene Units. Optical and Electrochemical Properties in Relation to CT Structure of the Polymer", J. Am. Chem Soc. (1996), 118(43), 10389-10399, XP002165566, Chart 2, p. 10391, col. 1.

(Continued)

*Primary Examiner*—D. Lawrence Tarazano
*Assistant Examiner*—Camie S Thompson
(74) *Attorney, Agent, or Firm*—Harness, Dickey & Pierce, PLC

(57) ABSTRACT

A soluble luminescent polymer comprising a first repeat unit $[Ar_1]$ and a second repeat unit comprising a unit of general formula (I) which is substituted or unsubstituted: wherein X is RC=CR, S, O or NR; $Ar_1$, $Ar_2$ and $Ar_3$ are each independently an aromatic or heteroaromatic group; and each R independently is hydrogen or a substituent group.

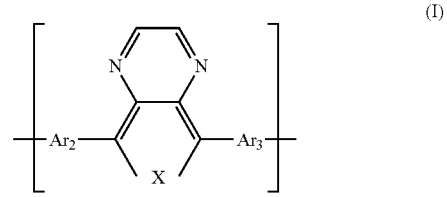

34 Claims, 1 Drawing Sheet

U.S. PATENT DOCUMENTS

Figure 1:
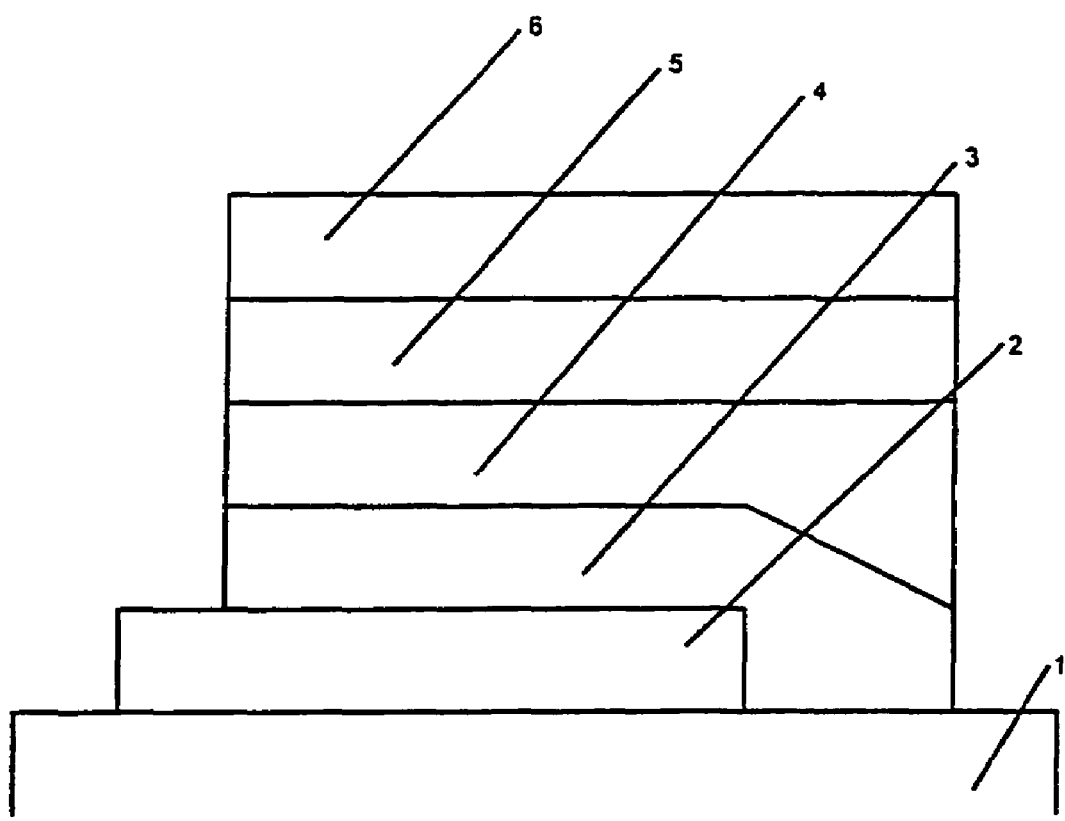

| | | | | |
|---|---|---|---|---|
| 5,777,070 | A * | 7/1998 | Inbasekaran et al. | 528/394 |
| 6,017,644 | A | 1/2000 | Toshida et al. | 428/690 |
| 6,242,561 | B1 * | 6/2001 | Mohwald et al. | 528/377 |
| 6,399,224 | B1 * | 6/2002 | Li | 428/690 |
| 6,413,658 | B1 * | 7/2002 | Araki | 428/690 |
| 6,605,373 | B2 * | 8/2003 | Woo et al. | 428/690 |
| 6,861,502 | B1 * | 3/2005 | Towns et al. | 528/422 |
| 2003/0045642 | A1 * | 3/2003 | Wu et al. | 525/204 |
| 2004/0115473 | A1 * | 6/2004 | Burroughes et al. | 428/690 |

FOREIGN PATENT DOCUMENTS

| | | |
|---|---|---|
| WO | 97 32914 | 9/1997 |
| WO | 98 49219 | 11/1998 |
| WO | 99 54385 | 10/1999 |
| WO | 00 46321 | 8/2000 |
| WO | WO 0055927 * | 9/2000 |

OTHER PUBLICATIONS

Ng P K et al: "Quinoxaline-Based Conjugated Polymers Containing Ruthenium(II) Bipyridine Metal Complex", Macromolecular: Rapid Communications, DE, Wiley VCH, Weinheim, vol. 18. No. 12, Dec. 1, 1997, pp. 1009-1016, XP000738968, ISSN: 1022-1336, cited in the application, Scheme 1.

Kitamura, Chitoshi et al: "Design of Narrow—Bandgap Polymers. Synthese and Properties of Monomers and Polymers Containing Aromatic—Donor and o-Quinoid-Acceptor Units", Chem. Mater. (1996), 8(2), 570-8, XP002165567, cited in the application, the whole document.

International Search Report, PCT/GB01/00825, ISA/EPO, Apr. 19, 2001.

Search Report—UK Patent Office collections, GB 0004541.9, Oct. 30, 2000.

* cited by examiner

LUMINESCENT POLYMER

CROSS-REFERENCE TO RELATED APPLICATIONS

This application is a national stage of international application PCT/GB01/00825, filed Feb. 26, 2001 (Patent Publication WO/01/62869), which claims the benefit of U.S. Provisional Application No. 60/207,724, filed on May 26, 2000 and Great Britain application GB 0004541.9 filed Feb. 25, 2000.

The present invention relates to a luminescent polymer, especially for use in an optical device such as an optical device comprising an electroluminescent device.

Electroluminescent devices are structures which emit light when subject to an applied electric field. In its simplest form, an electroluminescent device comprises a light-emissive layer between two electrodes. The cathode electrode injects negative charge carriers (electrons) and the anode electrode injects positive charge carriers (holes) into the light-emissive layer. Light emission occurs when the electrons and holes combine in the light-emissive layer to generate photons. As a practical aspect, one of the electrodes is typically transparent, to allow the photons to escape the device. The light-emissive layer should be made from a light-emissive material which may be laid down as a film without substantially affecting the luminescent characteristics of the material and which is stable at the operational temperature of the device.

The colour of the light generated by the light-emissive material is determined by the optical gap or bandgap of the organic light-emissive material, that is to say the difference in energy between the "highest occupied molecular orbital" (HOMO) and the "lowest unoccupied molecular orbital" (LUMO) levels. Effectively, the bandgap is the energy difference between the valance and conduction band. These levels can be estimated by photo emission measurements and measurements of the electrochemical potentials for oxidation and reduction. The level of these energies is affected by numerous factors. Accordingly, the use of such values is indicative rather than quantitative.

Organic electroluminescent devices which use an organic material as the light-emissive material are known in this art. Among organic materials, simple aromatic molecules such as anthracene, perylene and corenine are known to show electroluminescence. U.S. Pat. No. 4,539,507 discloses the use of small molecule organic materials as the light-emissive material.

Polymers are advantageous over small molecules when used in optical devices because polymer devices can be made on flexible substrates and layers of the polymer may be put down by economical coating methods. In addition, as discussed below, polymers have the possibility of tuning the bandgap by structure modification.

PCT/WO90/13148 discloses an electroluminescent device comprising a semiconductor layer comprising a polymer film as the light-emissive layer which comprises at least one conjugated polymer. In this case, the polymer film comprises a poly (para-phenylene vinylene) (PPV) film.

It is known to use a semiconductive conjugated copolymer as the light-emissive layer in an electroluminescent device, for example from EP 0544795. The semiconductive conjugated copolymer comprises at least two chemically different monomer units which, when existing in their individual homopolymer forms, typically have different semiconductor bandgaps. The proportion of the chemically different monomer units in the copolymer can be selected to control the semiconductor bandgap of the copolymer so as to control the optical properties of the copolymer. To some degree, the extent of conjugation of the copolymer can be said to affect the bandgap of the copolymer. Increasing the extent of conjugation has the effect of decreasing the bandgap up to the point of bandgap conversion. Therefore, selection of an appropriate polymer structure is one way of selecting the bandgap. This gives the very desirable feature of controlling the colour of the light output from the polymer when made to emit light. This property is useful particularly in the construction of electroluminescent devices.

EP 0686662 discloses a device for emitting green light. The anode is a layer of transparent indium-tin oxide. The cathode is a LiAl layer. Between the electrodes is a light-emissive layer of PPV. The device comprises also a hole transport layer of polyethylene dioxythiophene (PEDOT) which provides an intermediate energy level which aids the holes injected from the anode to reach the HOMO level in the PPV.

"Efficient blue-light emitting devices from conjugated polymer blends", Burgesson et al., Adv. Mater. 1996, 8, No. 12, pages 982-985 describes a blue-light emitting device which employs conjugated polymer blends. The emissive layer of the device consists of a blend of PDHPT with PDPP. Light emission is from the PDHPT alone.

Few low bandgap materials are known which show good optical device characteristics when used in an optical device. These characteristics include the quantum efficiency when excited to luminesce, the solubility and processability of the material and the lifetime when used in a device. Other relevant characteristics for consideration include the stability of the polymer during use and storage of the device.

A further disadvantage associated with low bandgap materials is that they are difficult to make. It may be noted that polymers made by electrochemical oxidative coupling usually are not suitable for use as emitters and in an electroluminescent device. This is because they have poor device characteristics. For example, such polymers will have a large number of so-called defects. Also, they are substantially insoluble and are not easily processable. An example of polymers made in this way are those disclosed in Chem. Mater. 1996, 8, page 570-578. The polymers disclosed therein were all obtained as insoluble deposits. Generally, the polymers disclosed in this document may be symbolised as $[A-Q-A]_n$, where A is a kind of aromatic-donor unit and Q is a kind of O-quinoid acceptor unit. The bandgaps of the disclosed polymers determined from optical absorption spectrum range from 0.5 to 1.4 electron volts.

Macromol. Rapid. Commun. 18,1009-1016 (1997) discloses a series of quinoxaline-based conjugated polymers which contain a ruthenium(II) bipyridine complex synthesised by the Suzuki coupling reaction. This document is particularly concerned with the desirable properties of metal-containing polymers and their promising applications.

Synthetic Metals, 76, (1996), 105-108 discloses a poly (phenyl quinoxaline). The electron-deficient quinoxaline group is disclosed as rendering this polymer of particular interest as an electron-transporting material for use in multi layer and composite film electroluminescent devices.

Despite work in the field of narrow bandgap polymers, there is still a need for electroluminescent polymers with a chemically tuneable red-light region emission. In particular, there is a need for such polymers which have, additionally, excellent device characteristics as discussed above. For the purposes of the present invention, the phrase red-light region means wavelengths in the range of 550 nm to 800 nm.

It is an aim of the present invention to overcome the deficiencies of the prior art and to provide such a polymer.

It is a further aim of the present invention to provide uses of the polymer.

Accordingly, the first aspect of the present invention provides a soluble luminescent polymer comprising a first repeat unit [Ar$_1$] and a second repeat unit comprising a unit of general formula I which is substituted or unsubstituted:

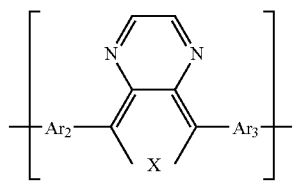
(I)

wherein X is RC=CR, S, O or NR and Ar$_1$, Ar$_2$ and Ar$_3$ are each independently an aromatic or heteroaromatic group and each R independently is hydrogen or any suitable substituent group.

Preferably, the first repeat unit is different from the second repeat unit.

The applicants have unexpectedly found that the structure of the present polymer may be selected so that the polymer acts as a low bandgap emitter when used in an optical device. Furthermore, the present applicants have found that the structure of the present polymer may be selected so that the polymer gives good red-light region emission, (i.e. 550 nm to 800 nm) in particular 550 nm to 750 nm or as defined by the CIE coordinates X=0.66 and Y=0.33. The present polymer has properties which give good device characteristics. These properties include solubility, processability, and good efficiency and lifetime in a device.

Organic materials having smaller optical gaps, towards the red end of the visible spectrum, are of particular interest to the present inventors. It is suggested that conjugated polymers that possess narrow bandgaps will be useful not only in optical devices but also in intrinsic organic conductors, non-linear optical devices, solar cells and IR emitters, detectors and sensors.

The present polymer does not comprise a metal complex.

Advantageously, a polymer according to the present invention has substantially no structural defects. In other words, it is substantially structurally regio regular. This is advantageous because this provides a level of certainty insofar as different samples of the same polymer will behave the same when used in an optical device. Usually, this will result in a fully conjugated polymer.

In one embodiment, the polymer is excluded where X is RC=CR, and Ar$_2$ and Ar$_3$ both comprise fluorene such that both fluorenes are directly bonded to the quinoxaline and the quinoxaline is one of:

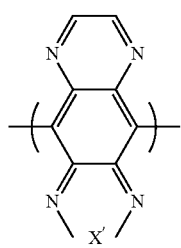 or 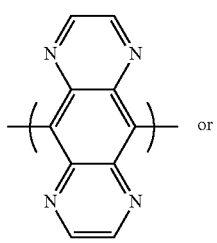

X' = O, S
substituted or unsubstituted substituted or unsubstituted

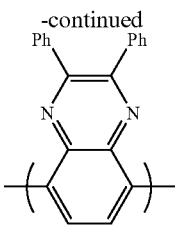

Preferably, the present polymer comprises a group having a formula a shown in general formula II which is substituted or unsubstituted:

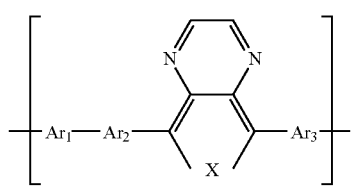
(II)

wherein X, Ar$_1$, Ar$_2$ and Ar$_3$ are defined as above. This arrangement increases conjugation along the polymer backbone and may result in a fully conjugated backbone.

Also, preferably, the present polymer has the following composition:

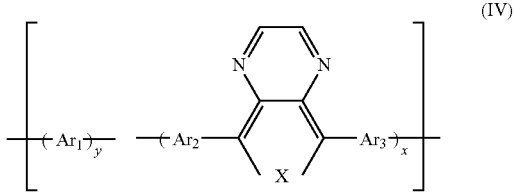
(IV)

where x is 0.1 to 99.9 mol % and y is 0.1 to 99.9 mol %. It is more preferred that x is 0.1 to 50 mol % and y is 50 to 99.9 mol %. Most preferably, x is 5 to 10 mol % and y is 90 to 95 mol %. These preferred compositions have been found to result in polymers with advantageously low bandgaps which give good red-light region emission.

In another aspect of the present invention, preferably, the second repeat unit of the present polymer comprises or even consists of the unit of general formula III:

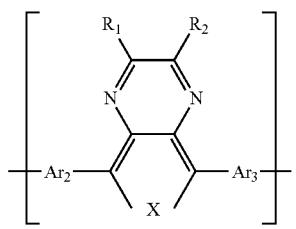
(III)

wherein R$_1$ and R$_2$ are the same or different and each comprise an H, or a substituted or unsubstituted alkyl, aryl, heteroaryl, alkoxy, alkylaryl, arylakyl, alkoxyaryl or alkoxyheteroaryl group. Preferably, at least one of $R_1$ and $R_2$ will comprise a substituted or unsubstituted aryl or heteroaryl group.

Selection of different substituent groups may be used to select properties of the polymer such as its solubility and extent of conjugation. Thus, also, these may usefully be selected to modulate the semiconductor bandgap of the polymer. As discussed above, this helps in HOMO/LUMO matching of the polymer with the device cathode, anode and host material. This can tune the wavelength and quantum efficiency of the polymer. To this end, preferably, $R_1$ and $R_2$ may comprise one or more substituents independently selected from the group consisting of alkyl, aryl, perfluoroalkyl, thioalkyl, cyano, alkoxy, heteroaryl, alkylaryl and arylalkyl groups. Specifically, preferred substituents of $R_1$ and $R_2$ are substituted or unsubstituted phenyl groups.

Preferably, for ease of synthesis, it is envisaged that $R_1$ and $R_2$ are the same. Furthermore, it is envisaged that, preferably, $R_1$ and $R_2$ are the same and are each a substituted or unsubstituted phenyl group.

The selection of X being HC=CH or RC=CR where R is a substituent group may be used, to some extent, to select the extent of conjugation and the bandgap of the polymer and thus to tune the wavelength and quantum efficiency of the polymer. Also, this selection may be used to improve the solubility of the polymer. Accordingly, in one preferred embodiment, X is HC=CH.

In other preferred embodiments, X is RC=CR and R comprises an alkyl, alkoxy, unfused aryl, unfused heteroaryl, aryloxy or heteroaryloxy group. In other words, in one preferred embodiment neither R is part of a fused ring system.

The applicants have found that $Ar_1$, $Ar_2$ and $Ar_3$ may advantageously comprise a substituted or unsubstituted, fused or unfused benzene, thiophene, furane, fluorene, triarylamine, bistriarylamine or pyridene group. Specifically, $Ar_1$, $Ar_2$ and $Ar_3$ may each independently comprise a 2-3-,2-5- or 2,6-substituted benzene; 3,4-substituted thiophene; 3,4-substituted furan; 9,9-disubstituted fluorene; unsubstituted pyridene; benzo-,thio- or furano-2,3-substituted diazine; unsubstituted phenothiodiazine; or an unsubstituted triarylamine or bistriarylamine group.

Advantageously, $Ar_1$, $Ar_2$ or $Ar_3$ each independently have one or more substituents. Preferred substituents include an H, amine, alkyl, aryl, heteroaryl, alkoxy, alkylaryl, arylalkyl, alkyloxy, aryloxy, alkoxyaryl or alkoxyheteroaryl group.

Selection of $Ar_1$, $Ar_2$ and $Ar_3$ and selection of different substituent groups on $Ar_1$, $Ar_2$ or $Ar_3$ may be used to select properties of the polymer such as its solubility and extent of conjugation.

Also, these may usefully be selected to modulate the semiconductor bandgap of the polymer. As discussed above, this helps in HOMO/LUMO matching of the polymer with the device cathode, anode and host material. This can tune the wavelength and quantum efficiency of the polymer.

In a preferred embodiment, for ease of synthesis, $Ar_2$ and $Ar_3$ are the same. In a further preferred embodiment, $Ar_2$ and $Ar_3$ are the same and are each an unsubstituted thiophene group. This has been found to result in a polymer which gives particularly good red-light region emission and which has good efficiency and lifetime in a device.

In another preferred embodiment, $Ar_1$ is different from $Ar_2$ and $Ar_3$ and optionally $Ar_2$ and $Ar_3$ are the same. Preferably, $Ar_1$ is a substituted or unsubstituted triarylamine group. Again, this has been found to result in a polymer which gives particularly good red-light region emission and which has good efficiency and lifetime in a device.

In one embodiment, $Ar_2$ and $Ar_3$ are the same and each is not a fluorene group.

It is envisaged that the present polymer may further comprise a third repeat unit [$Ar_4$] which is an aromatic or heteroaromatic group. This can be used to maintain the extent of conjugation along the length of the polymer backbone. $Ar_4$ may be the same or different from any one of $Ar_1$, $Ar_2$ and $Ar_3$. When the present polymer comprises a third repeat unit, it is preferred that the polymer comprises a group having a formula as shown in general formula V:

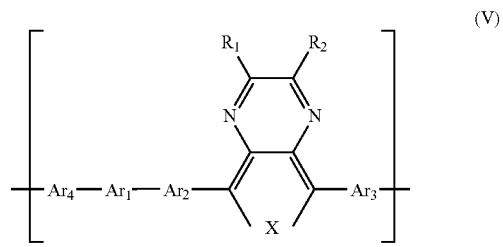

(V)

wherein $Ar_1$, $Ar_2$, $Ar_3$, $Ar_4$, $R_1$ and $R_2$ are as defined in any of the above embodiments.

In one further preferred embodiment, when the present polymer comprises a third repeat unit, the polymer has the following composition:

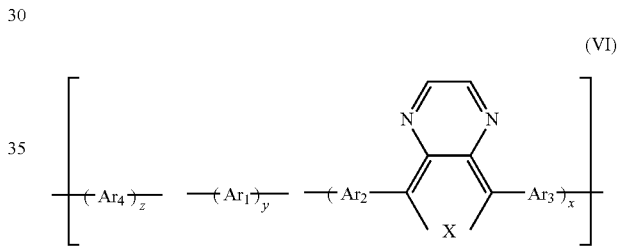

(VI)

wherein X, $Ar_1$, $Ar_2$, $Ar_3$, $Ar_4$, $R_1$ and $R_2$ as defined in any of the above embodiments and x is 0.1 to 99.8 mol %, y is 0.1 to 99.8 mol % and z is 0.1 to 99.8 mol %. More preferably, x is around 25 mol %, y is around 25 mol % and z is around 50 mol %. These preferred compositions have been found to result in polymers which give good red-light region emission.

The inventors have found that, in particular, polymers in accordance with the present invention shows excellent red light emission when excited to luminesce. This excellent red light emission may be defined by the CIE coordinates X=0.66 and Y=0.33. Such polymers are expected to be extremely useful as an emitter in optical devices, particularly optical devices comprising an electroluminescent device.

As described above, the extent of conjugation of the present polymer affects the semiconductor bandgap of the polymer. Therefore, typically the polymer is at least partially conjugated or even substantially or fully conjugated.

Polymers according to the present invention provide materials with the attractive physical and processing properties of polymers and the ability in their synthesis to select the aryl or heteroaryl groups and their substituents so as to modulate the bandgap of the polymers.

Usually, the degree of polymerisation of polymers in accordance with the present invention is at least three.

Preferably, polymers according to the present invention will have an average molecular weight of at least $m_n$=10,000.

Higher molecular weight polymers have improved properties such as improved processability and phase separation behaviour.

Polymers according to the present invention include linear polymers, oligomers, homopolymers, copolymers and terpolymers. Preferably, the polymer is a copolymer or terpolymer and not a homopolymer. In this regard, a structural unit or repeat unit is distinguished from a monomeric unit. A homopolymer (i.e. prepared by polymerisation of a single type of monomer) may be defined to have more than one different structural or repeat unit.

A film or coating comprising a polymer in accordance with the present invention also is provided.

According to a second aspect of the present invention, there is provided the use of the present polymer as a component of an optical device. Specifically, the optical device may comprise an electroluminescent device.

In order for the polymer to have good device characteristics it is soluble. Substituents may usefully be selected to confer on the polymer solubility in a particular solvent system, for example for depositing the polymer on a substrate. Typically solvents include common organic solvents, for example toluene, xylene, THF and organic ink-jet ink formulations.

According to a third aspect of the present invention, there is provided an electroluminescent device comprising a first charge injecting layer for injecting positive charge carriers, a second charge injecting layer for injecting negative charge carriers, and a light-emissive layer located between the first and second charge injecting layers comprising a light-emissive material for accepting and combining positive and negative charge carriers to generate light. The light-emissive layer comprises a polymer according to the first aspect of the present invention for (i) transporting negative charge carriers from the second charge injecting layer to the light-emissive material (ii) transporting positive charge carriers from the first charge injecting layer to the light-emissive material or, most preferably, (iii) accepting and combining positive and negative charge carriers to generate light.

It will be appreciated that the light-emissive layer may be formed from a blend of materials including one or more polymers according to the present invention, and optionally further different polymers. As mentioned above, the one or more polymers according to the present invention may be included in order to improve the efficiency of hole and/or electron transport from the electrodes to the light-emissive material. Alternatively, it is preferred that at least one is included as the light-emissive material itself. In this case, the blend would comprise from 0.1% to 100% by weight, usually from 1 to 20% or around 10% of a polymer according to this invention with the remainder of the blend comprising hole and/or electron transport polymers.

Accordingly, the present invention also provides a composition comprising a mixture/blend comprising one or more polymers according the first aspect of this invention.

Alternatively, a polymer according to the present invention may be provided in an electroluminescent device as a discrete layer situated between either the first or second charge injecting layer and a discrete layer comprising the light-emissive material. Also, it may be provided as a discrete layer which is the light-emissive material. These discrete layers optionally may be in contact with one or more (additional) hole and/or electron transporting layers.

The skilled person will know from general knowledge how to prepare first and second repeat unit monomers in accordance with the present invention.

Generally speaking, polymers according to the present invention may be prepared by one of several polymerisation methods.

One suitable method, particularly for the preparation of homopolymers, is disclosed in Macromolecules, 1998, 31, 1099-1103. The polymerisation reaction involves nickel-mediated coupling of dibromide monomers. This method commonly is known as "Yamamoto Polymerisation".

Another suitable method is disclosed in U.S. Pat. No. 5,777,070. The process involves contacting monomers having two reactive groups selected from boronic acid, C1-C6 boronic acid ester, C1-C6 borane and combinations thereof with aromatic dihalide functional monomers or monomers having one reactive boronic acid, boronic acid, boranic acid ester or boring group and one reactive halide functional group with each other. This reaction is known to those skilled in this art as "Suzuki Polymerisation".

A preferred method of preparation is described in International patent publication No. WO 00/53656, the contents of which are incorporated herein by reference. This describes the process for preparing a polymer, which comprises polymerising in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a catalyst (e.g. palladium) suitable for catalysing the polymerisation of the aromatic monomers, and an organic base in an amount sufficient to convert the reactive boron derivative functional groups into —$BX_3^-$ anionic groups, wherein X is independently selected from the group consisting of F and OH.

Polymers according to the present invention which have been produced by this method are particularly advantageous. This is because reaction times are short and residual catalyst (e.g. palladium) levels are low.

The skilled person is credited with the knowledge of knowing which of the above methods would be most suitable for preparing a particular polymer in accordance with the present invention.

According to a fourth aspect of the present invention there is provided a process for preparing a polymer as defined above which comprises polymerising in a reaction mixture:
(a) a first aromatic monomer comprising
  (i) a first repeat unit as defined above; and/or
  (ii) a second repeat unit having general formula I as defined above, and at least two reaction boron derivative groups selected from a boronic acid group, a boronic ester group and a borane group; and
(b) a second aromatic monomer comprising the other or further of the first and/or second repeat units and at least two reactive halide functional groups, wherein the reaction mixture contains a catalytic amount of a palladium catalyst, and an organic base in an amount sufficient to convert the reactive boron derivative groups into —$B(OH)_3$ anions.

A further process according to the fourth aspect of this invention for preparing a polymer as defined above also is provided which comprises polymerising in a reaction mixture:
(a) a first aromatic monomer comprising
  (i) a first repeat unit as defined above; and/or
  (ii) a second repeat unit having general formula I as defined above, and one reactive halide functional group and one reactive boron derivative group; and (b) a second aromatic monomer comprising the other or further of the first and/or second repeat units, and one reactive halide functional group and one reactive boron derivative group, wherein each borane derivative group is selected from a boronic acid group, a boronic ester group and a borane group and the reaction mixture contains a catalytic amount of a palladium catalyst, and an organic base in an amount sufficient to convert the reactive boron derivative groups into —B(OH)$_3^-$anions.

According to a fifth aspect of the present invention there is provided a compound:

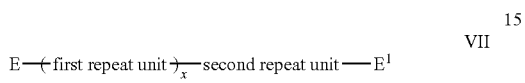

VII for use in a polymerisation reaction for the preparation of a polymer, particularly a polymer according to this invention. Also provided is the use of the above compound for the preparation of a polymer according to the first aspect of this invention for transporting holes and/or electrons and/or for accepting and combining holes and electrons to generate light in an optical device. The first and second repeat units in this compound are as defined in relation to any aspect or embodiment of this invention described above, x may be 0 or 1 and E and E$^1$ are the same or different and are reactive groups capable of undergoing chain extension.

Preferably, E and E$^1$ are the same or different and are selected from the group consisting of a reactive halide functional group and a reactive boron derivative group. More preferably, the reactive halide functional group is selected from the group consisting of F, Cl, Br or I and the borane derivative group is selected from the group consisting of a boronic acid group, a boronic ester group or a borane group.

The present invention now will be described in more detail with reference to the accompanying drawings in which:

FIG. 1 is a schematic diagram of an optical device according to the present invention.

One preferred polymer in accordance with the present invention is the polymer having composition:

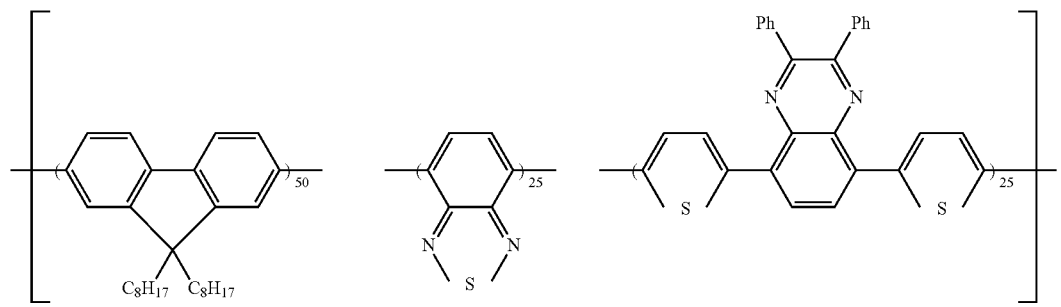

One example of a blend including a polymer according to the present invention that could be used in an electroluminescent device is a blend of the preferred polymer according to this invention referred to above with a dioctylfluorene benzothiadiazole polymer and poly(2,7-(9,9-di-n-octylfluorene)-(1,4-phenylene-((4-secbutylphenyl)imino)-1,4-phenylene) ("TFB").

EXAMPLES

Example 1

Preparation of the Polymer

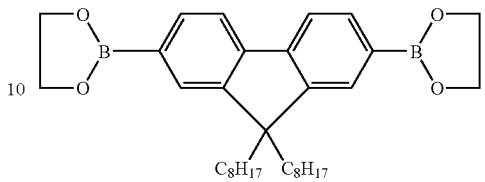

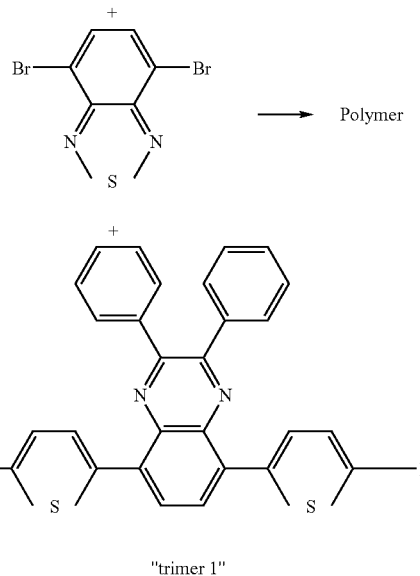

"trimer 1"

A suspension of 9,9-dioctylfluorene-diester (4.82 g, 9.09 mmol), dibromo-benzothiodiazine (1.323 g, 4.5 mmol), "trimer 1" (2.720 g, 4.5 mmol) and tetrakis (triphenyl phosphine) palladium (0) (30 mg) in toluene (90 mL) was de-gased with nitrogen. After 1 hour, tetraethyl ammonium hydroxide (30 mL) was added to the reaction mixture and the suspension heated to ~115° C. (external temp.). The reaction was end-capped with bromobenzene (15 mL) after 20 hours. Stirring was maintained at 115° C. for 1 hour then phenyl boronic acid (2.5 g) was added and stirring continued for a further 1.5 hours. Once the reaction mixture had cooled to r.t. the polymer was precipitated into methanol (4L). The polymer was filtered off and re-dissolved in toluene (500 mL). A solution of dithiocarbamic acid (30 g) in H₂O (220 mL) was added to the toluene solution. The salt mixture was heated to 65° C. for 18 hours and then the aqueous layer was removed. The organic phase was passed down an alumina/silica column, eluting the polymer with toluene. The toluene was condensed to 350 mL and then precipitated into methanol (4L). The polymer was filtered off and dried thoroughly. The yield was 62%.

Example 3

Electroluminescent Device

A suitable device structure is shown in FIG. 1. The anode 2 is a layer of transparent indium-tin oxide ("ITO") supported on a glass or plastic substrate 1. The anode 2 layer has a thickness between 1000-2000 Å, usually about 1500 Å. The cathode 5 is a Ca layer having an approximate thickness of 1500 Å. Between the electrodes is a light emissive layer 4 having a thickness up to about 1000 Å. The emissive layer 4 comprises between 0.5 to 30% by weight of the present polymer with the remainder of the emissive layer consisting of hole and/or electron transport material. Advantageously, the device includes a hole transport material layer 3 of PEDOT having a thickness of about 1000 Å. Layer 6 is an encapsulant layer of a suitable thickness.

The invention claimed is:

1. A method of making a polymer comprising polymerizing a compound having general formula VII:

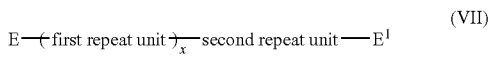

where x=0 or 1 and E and E¹ are the same or different and are reactive groups capable of undergoing chain extension and where the first repeat unit has formula [Ar₁] and the second repeat unit comprises a unit of general formula I which is substituted or unsubstituted:

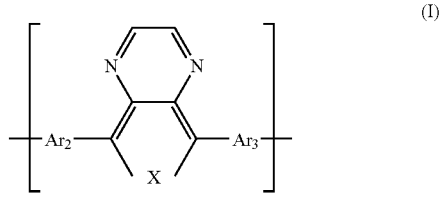

wherein X is RC=CR, S, O or NR;
Ar₁, Ar₂ and Ar₃ are each independently an aromatic or heteroaromatic group; and
each R independently is hydrogen or a substituent group.

2. A method according to claim 1, wherein the first repeat unit is different from the second repeat unit.

3. A method according to claim 1, which comprises a group having a formula as shown in general formula II which is substituted or unsubstituted:

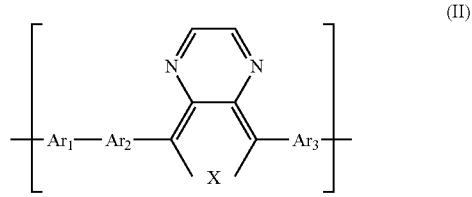

wherein X, Ar₁, Ar₂ and Ar₃ are as defined in claim 1.

4. A method according to claim 1, wherein the second repeat unit comprises a unit of general formula III:

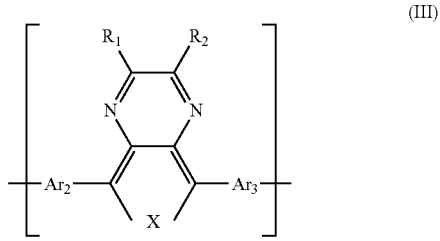

wherein R₁ and R₂ are the same or different and each comprise an H or a substituted or unsubstituted alkyl, aryl, heteroaryl, alkoxy, aryloxy, alkylaryl, arylakyl, alkoxyaryl or alkoxyheteroaryl group.

5. A method according to claim 4, wherein R₁ and R₂ are the same and each a substituted or unsubstituted phenyl group.

6. A method according to claim 1, wherein X is HC=CH.

7. A method according to claim 1, wherein Ar₁, Ar₂ and Ar₃ each independently comprise a substituted or unsubstituted, fused or unfused benzene, thiophene, furan, fluorene, triarylamine, bistriarylamine or pyridine group.

8. A method according to claim 1, wherein Ar₂ and Ar₃ are the same.

9. A method according to claim 8, wherein Ar₂ and Ar₃ are each an unsubstituted thiophene group.

10. A method according to claim 1, wherein Ar₁ is a substituted or unsubstituted triarylamine group.

11. A method according to claim 1 where E and E¹ are the same or different and are selected from the group consisting of a reactive halide functional group and a reactive boron derivative group.

12. A method according to claim 11 where the reactive halide functional group is selected from the group consisting of F, Cl, Br and I and the boron derivative group is selected from the group consisting of a boronic acid group, a boronic ester group and a borane group.

13. A soluble luminescent polymer comprising a first repeat unit (Ar₁) and a second repeat unit; wherein Ar₁ is selected from the group consisting of a substituted or unsubstituted, fused or unfused benzene, thiophene, furan, fluorene, triarylamine, bistriarylamine or pyridine group, and the second repeat unit is selected from the group consisting of a unit of general formula I which is substituted or unsubstituted:

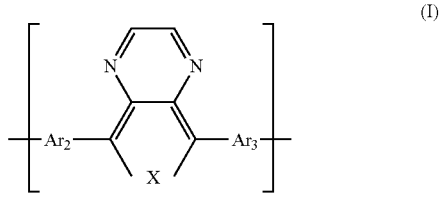

wherein X is RC=CR, S, O or NR;
Ar₁, Ar₂ and Ar₃ are each independently an aromatic or heteroaromatic group; and
each R independently is hydrogen or a substituent group; or a unit of general formula III:

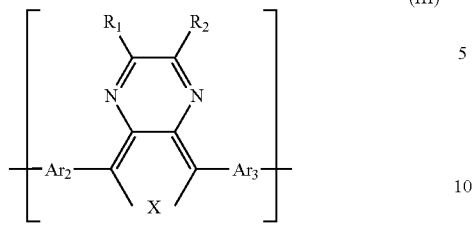

(III)

wherein R3 and R2 are the same or different and each comprise an H or a substituted or unsubstituted alkyl, aryl, heteroaryl, alkoxy, aryloxy, alkylaryl, arylalkyl, alkoxyaryl or alkoxyheteroaryl group and wherein $Ar_1$ is different from $Ar_2$ and $Ar_3$.

14. A polymer according to claim 13 which comprises a third repeat unit [$Ar_4$] which is an aromatic or heteroaromatic group and is different from $Ar_1$, $Ar_2$ and $Ar_3$.

15. A polymer according to claim 14, which comprises a group having a formula as shown in general Formula V:

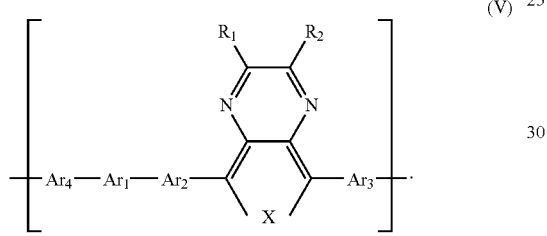

(V)

16. A polymer according to claim 14, having the following composition:

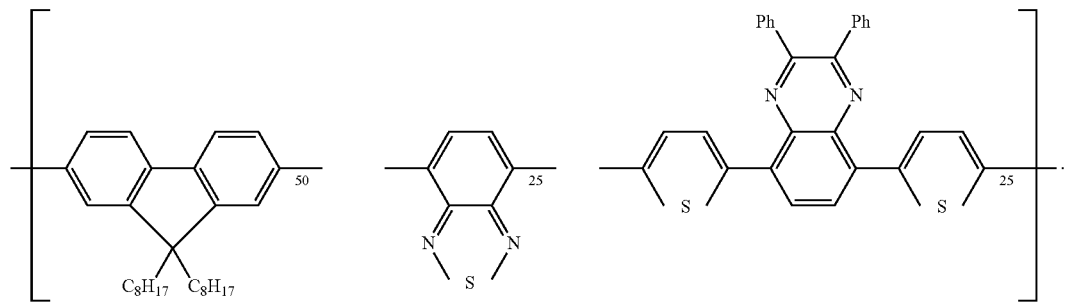

17. A process for preparing a luminescent polymer as defined in claim 13, which comprises polymerizing in a reaction mixture:
(a) a first aromatic monomer comprising
(i) a first repeat unit ($Ar_1$) is selected from the group consisting of a substituted or unsubstituted, fused or unfused benzene, thiophene, furan, fluorene, triarylamine, bistriarylamine or pyridine group; and/or
(ii) a second repeat unit having a general formula is selected from the group consisting of a unit of general formula I which is substituted or unsubstituted:

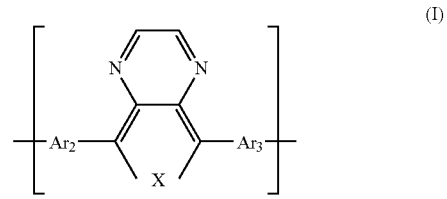

(I)

wherein X is RC=CR, S, O or NR;
$Ar_1$, $Ar_2$ and $Ar_3$ are each independently an aromatic or heteroaromatic group; and each R independently is hydrogen or a substituent group; or a unit of general formula III:

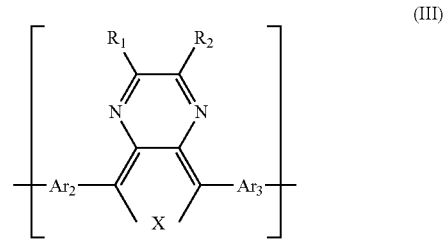

(III)

wherein $R_1$ and $R_2$ are the same or different and each comprise an H or a substituted or unsubstituted alkyl, aryl, heteroaryl, alkoxy, aryloxy, alkylaryl, arylalkyl, alkoxyaryl or alkoxyheteroaryl group;
and at least two reactive boron derivative groups selected from a boronic acid group, a boronic ester group and a borane group; and
(b) a second aromatic monomer comprising the other or further of the first or second repeat units and at least two reactive halide functional groups, wherein the reaction mixture contains a catalytic amount of a catalyst, and an organic base in an amount sufficient to convert the reactive boron derivative groups into —$B(OH)_3$ anions.

18. A process for preparing a luminescent polymer as defined in claim 13, which comprises polymerizing in a reaction mixture:
(a) a first aromatic monomer comprising
(i) a first repeat unit ($Ar_1$) is selected from the group consisting of a substituted or unsubstituted, fused or unfused benzene, thiophene, furan, fluorene, triarylamine, bistriarylamine or pyridine group; and/or (ii) a second repeat unit having general a formula is selected from the group consisting of a unit of general formula I which is substituted or unsubstituted:

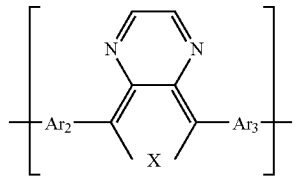
(I)

wherein X is RC=CR, S, O or NR;
Ar$_1$, Ar$_2$ and Ar$_3$ are each independently an aromatic or heteroaromatic group; and
each R independently is hydrogen or a substituent group; or a unit of general formula III:

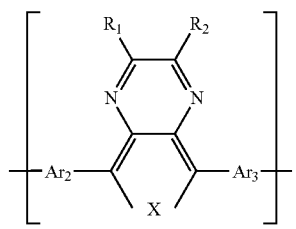
(III)

wherein R$_1$ and R$_2$ are the same or different and each comprise an H or a substituted or unsubstituted alkyl, aryl, heteroaryl, alkoxy, aryloxy, alkylaryl, arylalkyl, alkoxyaryl or alkoxyheteroaryl group;
and one reactive halide functional group and one reactive boron derivative group; and
(b) a second aromatic monomer comprising the other of the first or second repeat units and one reactive halide functional group and one reactive boron derivative group, wherein each borane derivative group is selected from a boronic acid group, a boronic ester group and a borane group and the reaction mixture comprises a catalytic amount of a catalyst, and an organic base in an amount sufficient to convert the reactive boron derivative groups into —B(OH)$_3$ anions.

19. An optical device or a component therefore, which comprises a substrate and a polymer as defined in claim 13, supported on the substrate.

20. An optical device or a component therefore, according to claim 19, wherein the optical device comprises an electroluminescent device.

21. An electroluminescent device according to claim 20 comprising: a first charge injecting layer for injecting positive charge carriers;
  a second charge injecting layer for injecting negative charge carriers:
  a light-emissive layer located between the first and second charge injecting layers comprising a light-emissive material for accepting and combining positive and negative charge carriers to generate light:
wherein the light-emissive layer comprises a polymer as defined in claim 14 for (i) transporting positive and/or negative charge carriers from the first and/or second charge injecting layer to the light-emissive material or (ii) accepting and combining positive and negative charge carriers to generate light.

22. A composition comprising a mixture comprising a polymer as defined in claim 13.

23. A compound for the preparation of a polymer having general formula VII:

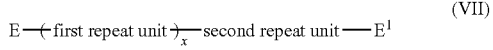
(VII)

where x =1 and E and E$^1$ are the same different and are reactive groups capable of undergoing chain extension and where the first repeat unit has formula [Ar] and the second repeat unit comprises a unit of general formula I which is substituted or unsubstituted:

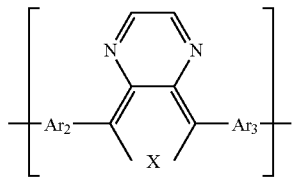
(I)

wherein X is RC=CR, S, O or NR;
Ar$_1$, Ar$_2$ and AR$_3$ are each independently an aromatic or heteroaromatic group; and
each R independently is hydrogen or substituent group.

24. A compound according to claim 23, wherein the first repeat unit is different from the second repeat unit.

25. A compound according to claim 23, wherein the second repeat unit comprises a unit of general formula III:

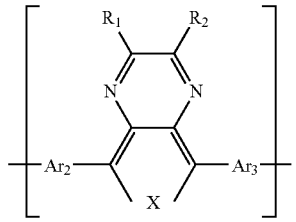
(III)

wherein R$_1$ and R$_2$ are the same or different and each comprise an H or a substituted or unsubstituted alkyl, aryl, heteroaryl, alkoxy, aryloxy, alkylaryl, arylalkyl, alkoxyaryl or alkoxyheteroaryl group.

26. A compound according to claim 23, wherein R$_1$ and R$_2$ are the same and each a substituted or unsubstituted phenyl group.

27. A compound according to claim 23, wherein X is HC=CH.

28. A compound according to claim 23, wherein Ar$_1$, Ar$_2$ and Ar$_3$ each independently comprise a substituted or unsubstituted, fused or unfused benzene, thiophene, furan, fluorene, triarylamine, bistriarylamine or pyridine group.

29. A compound according to claim 23, wherein Ar$_2$ and Ar$_3$ are the same.

30. A compound according to claim 23, wherein Ar and Ar$_3$ are each an unsubstituted thiophene group.

31. A compound according to claim 23, wherein Ar$_1$ is a substituted or unsubstituted triarylamine group.

32. A compound according to claim 23 where E and E$^1$ are the same or different and are selected from the group consisting of a reactive halide functional group and a reactive boron derivative group.

33. A compound according to claim 23 where the reactive halide functional group is selected from the group consisting of F, Cl, Br and the boron derivative group is selected from the group consisting of a boronic acid group, a boronic ester group and a borane group.

34. A method of making a polymer comprising polymerizing a compound having general formula VII:

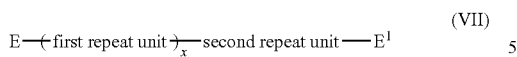

(VII)

where x =0 or 1 and E and E¹ are the same or different and are reactive groups capable of undergoing chain extension and where the first repeat unit has formula [Ar$_1$] and the second repeat unit comprises a unit having one of the formulas:

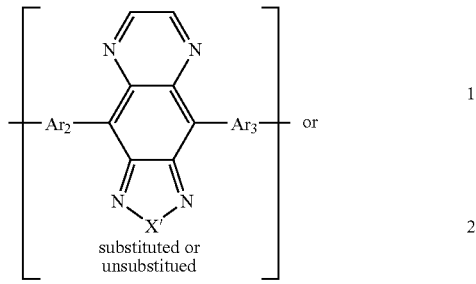

or

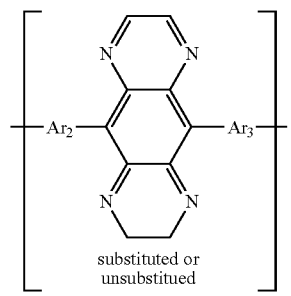

wherein X' is S, O or NR;

Ar$_1$ is an aromatic or heteroaromatic group; and Ar$_2$ and Ar$_3$ are fluorene.

* * * * *